(12) United States Patent
Hwang

(10) Patent No.: US 7,977,143 B2
(45) Date of Patent: Jul. 12, 2011

(54) CMOS IMAGE SENSOR AND FABRICATING METHOD THEREOF

(75) Inventor: Jong Taek Hwang, CheongJu-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 262 days.

(21) Appl. No.: 12/250,243

(22) Filed: Oct. 13, 2008

(65) Prior Publication Data

US 2009/0101951 A1    Apr. 23, 2009

(30) Foreign Application Priority Data

Oct. 18, 2007   (KR) .................. 10-2007-0105079

(51) Int. Cl.
    *H01L 21/00*   (2006.01)
(52) U.S. Cl. ........... 438/70; 257/E31.127; 257/E27.134; 257/E27.135
(58) Field of Classification Search .............. 257/292, 257/E27.13, E31.127, E31.121, E31.124, 257/E27.134, E27.135, E51.022; 438/60, 438/57, 66, 69, 70–72, 98
    See application file for complete search history.

(56) References Cited

U.S. PATENT DOCUMENTS

| | | | | |
|---|---|---|---|---|
| 6,379,992 B2* | 4/2002 | Jo | | 438/70 |
| 7,524,770 B2* | 4/2009 | Park | | 438/713 |
| 2005/0130071 A1* | 6/2005 | Lee | | 430/320 |
| 2005/0263835 A1* | 12/2005 | Sakama et al. | | 257/411 |
| 2005/0269656 A1* | 12/2005 | Shian-Ching et al. | | 257/440 |
| 2006/0011932 A1* | 1/2006 | Kim | | 257/98 |
| 2008/0090323 A1* | 4/2008 | Wu | | 438/70 |
| 2008/0135962 A1* | 6/2008 | Ryu | | 257/432 |
| 2008/0149974 A1* | 6/2008 | Song | | 257/292 |
| 2008/0157154 A1* | 7/2008 | Kim | | 257/294 |
| 2008/0272452 A1* | 11/2008 | Hwang | | 257/432 |
| 2008/0286897 A1* | 11/2008 | Jung | | 438/70 |
| 2010/0044819 A1* | 2/2010 | Jeong et al. | | 257/432 |

FOREIGN PATENT DOCUMENTS

KR    2003057646 A  *  7/2003

* cited by examiner

*Primary Examiner* — Matthew C Landau
*Assistant Examiner* — Latanya Crawford
(74) *Attorney, Agent, or Firm* — The Law Offices of Andrew D. Fortney; Andrew D. Fortney; Duangkamol Kay Strohl

(57) ABSTRACT

A CMOS image sensor and fabricating method thereof are disclosed. The method includes forming a plurality of photodiode regions on a semiconductor substrate, forming a plurality of color filters respectively corresponding to the photodiode regions, forming a planarization layer on the color filters, forming a protective layer on the planarization layer, and forming a microlens layer comprising a plurality of microlenses corresponding to the photodiode regions by depositing a low-temperature oxide layer on the protective layer and then patterning the low-temperature oxide layer. After the planarization layer is formed, the protective layer is formed by plasma processing. Thus, the planarization layer can be protected from chemical penetration via numerous pin holes in the microlens layer in the course of wet processing. Accordingly, the method prevents the microlens from lifting from the planarization layer.

20 Claims, 9 Drawing Sheets

CMOS IMAGE SENSOR AND FABRICATING METHOD THEREOF

This application claims the benefit of the Korean Patent Application No. 10-2007-0105079, filed on Oct. 18, 2007, which is hereby incorporated by reference as if fully set forth herein.

BACKGROUND OF THE INVENTION

1. Field of the Invention

The present invention relates to an image sensor and fabricating method thereof, and more particularly, to a CMOS image sensor and fabricating method thereof. Although the present invention is suitable for a wide scope of applications, it is particularly suitable for the CMOS image sensor including a microlens formed of or comprising silicon oxide.

2. Discussion of the Related Art

Generally, an image sensor is a semiconductor device for converting an optical image to electric signals. Image sensors may be categorized mainly into charge coupled devices (CCDs) and CMOS (complementary metal oxide silicon) image sensors.

In the charge coupled device (CCD), a plurality of photodiodes (PD) for converting an optical signal to an electric signal are aligned in a matrix form. The CCD consists of a plurality of vertical charge coupled devices (VCCD), a horizontal charge coupled device (HCCD) and a sense amplifier. Each of a plurality of the VCCDs is provided between vertical photodiodes arranged in a matrix form and plays a role in transporting a charge generated from the corresponding photodiode in a vertical direction. The HCCD plays a role in transporting a charge transported by each of the VCCDs in horizontal direction. And, the sense amplifier outputs an electric signal by sensing the charge transported in horizontal direction.

Yet, the above-described CCD has a relatively complicated driving mechanism, consumes relatively high power, and needs a multi-step photo process. Hence, it is disadvantageous in that the CCD fabricating process may be relatively complicated. Moreover, it is difficult to integrate a control circuit, a signal processing circuit, an analog/digital (A/D) converter and the like on a CCD chip. Hence, it may be challenging to reduce the size of the CCD product.

Recently, attention has been paid to CMOS image sensors as a next generation image sensor to overcome the disadvantages of the CCD. The CMOS image sensor is a device adopting a switching system for sequentially detecting and/or processing an output of each unit pixel by MOS transistors. The MOS transistors are generally formed according to the number of unit pixels on a semiconductor substrate, using CMOS technology that can also be used to form control circuits, signal processing circuits and the like as peripheral circuits.

Namely, the CMOS image sensor implements an image by capturing light-induced charges in a photodiode, sensing the charges using one or more MOS transistors in the unit pixel, and then detecting an electric signal from each unit pixel using a switching system.

As the CMOS image sensor is made using CMOS fabrication technology, it has advantages such as relatively small power consumption, a relatively simple fabrication process using a relatively small number of photolithography process steps, and the like. Moreover, the CMOS image sensor, for which a control circuit, a signal processing circuit, an A/D converter and the like can be integrated on a CMOS image sensor chip, has an advantage in facilitating a reduction in the size of the image sensor product. Therefore, the CMOS image sensor is applicable to various fields including digital still cameras, a digital video cameras, and the like.

FIG. 1 is an exemplary circuit diagram of a four-transistor (4T) type unit pixel for a CMOS image sensor, and FIG. 2 is an exemplary layout of a general 4T type CMOS image sensor unit pixel.

Referring to FIG. 1, a unit pixel 100 of a CMOS image sensor consists of a photodiode 10 as a photoelectric converting unit and four transistors. In this case, the four transistors include a transfer transistor 20, a reset transistor 30, a drive transistor 40 and a select transistor 50. An optional load transistor 60 is electrically connected to an output terminal OUT of the unit pixel 100. In this case, the reference 'FD' indicates a floating diffusion region, 'Tx' indicates a gate voltage of the transfer transistor 20, 'Rx' indicates a gate voltage of the reset transistor 30, 'Dx' indicates a gate voltage of the drive transistor 40, and 'Sx' indicates a gate voltage of the select transistor 50.

A unit pixel of a general 4T type CMOS image sensor, as shown in FIG. 2, includes an active area defined by a device isolation area (not shown, but formed in parts or regions of the unit pixel other than the active area). A single photodiode PD is formed in a relatively wide part of the active area, and gate electrodes 23, 33, 43 and 53 of four transistors are formed on/over the remaining part of the active area. Namely, the transfer transistor 20 includes the gate electrode 23, the reset transistor 30 includes the gate electrode 33, the drive transistor includes the gate electrode 43, and the select transistor 50 includes the gate electrode 53. In this case, source/drain (S/D) regions are formed in the active area adjacent to each of the transistor gates, but not beneath each of the gates 23, 33, 43 and 53, by ion implantation.

A general image sensor including a plurality of pixels intensively arranged in rows and columns includes a photodiode PD generating photoelectrons by detecting external light, a floating diffusion region FD delivering an electric charge generated from the photodiode, and a transfer transistor Tx provided between the photodiode PD and the floating diffusion region FD to transfer the electric charge generated from the diode PD to the floating diffusion region FD.

An operational sequence of the above-configured CMOS image sensor is explained in brief as follows. First of all, as the reset transistor Rx is turned on, a potential of an output floating diffusion node becomes VDD. In this case, a reference value is detected.

Subsequently, if light enters the photodiode PD, which is a light receiving unit, from outside of the image sensor, electron-hole pairs (EHPs) are generated in proportion to the light. By the signal charge generated from the photodiode PD, a potential of a source node of the transfer transistor Tx varies in proportion to a quantity of the generated signal charge.

If the transfer transistor Tx is turned on, the accumulated signal charge is transferred to the floating diffusion region FD. A potential of the output floating diffusion node is changed in proportion to the transferred signal charge quantity as soon as a gate bias of the drive transistor Dx is changed. This eventually results in a change of a source potential of the drive transistor Dx. In this case, if the select transistor Sx is turned on, data is read out to a column read circuit of the image sensor.

Subsequently, as the reset transistor Rx is turned on, the potential of the output floating diffusion node becomes VDD. And, the above process is repeated.

A CMOS image sensor according to the related art is explained with reference to FIG. 3 as follows.

Referring to FIG. 3, a CMOS image sensor according to the related art consists of a device isolation layer 102 in a device isolation area of a semiconductor substrate 101, a plurality of photodiode regions 103 in the active areas of the semiconductor substrate 101, an insulating interlayer 104 over the semiconductor substrate 101 including the photodiode regions 103, a first planarization layer 105 on the insulating interlayer 104, a color filter layer 106 (containing red [R], green [G] and blue [B] color filters) on the first planarization layer 105 to correspond to the photodiode regions 103, respectively, a second planarization layer 107 over the semiconductor substrate 101 including the color filter layer 106, and a plurality of microlenses 108 on the second planarization layer 107 to correspond to the color filters in the color filter layer 106. In this case, various transistors (not shown in the drawing) and metal wires (not shown in the drawing) are formed on, in or over the active areas (and, in the case of the metal wires, over the device isolation areas) of the semiconductor substrate 101.

In the above-configured CMOS image sensor according to the related art, one color filter in the color filter layer 106 is formed per color over the photodiode region 103 to receive a red, green or blue (R/G/B) signal. To receive more light, the microlens 108 is provided over the light-receiving unit. The respective signals are connected to an image processing circuit provided outside the light receiving unit via a plurality of metal wires and are then combined into a single image.

If the microlens shown in FIG. 3 is formed of silicon oxide instead of the conventional organic substance, it is able to prevent the microlens from being contaminated by particles generated from sawing the wafer in the course of packaging a device. However, the oxide substance for the microlens may be deposited at a relatively low temperature, resulting in a layer quality that is not as dense as possible. As a consequence, pin holes exist within the microlens layer. Due to this problem, chemicals may penetrate through the oxide microlens during a wet process to dissolve organic substances of the second planarization layer (or an overlying resist or resist pattern), whereby the microlens 108 may peel off from the second planarization layer 107.

Moreover, when certain oxides are deposited at a low temperature (e.g., to form the microlens in the related art process), it can be observed that many pin holes exist in the silicon oxide. If a wet process is further performed, the planarization layer 107 may be partially dissolved, whereby the microlens 108 may exfoliate or peel off from the planarization layer 107.

SUMMARY OF THE INVENTION

Accordingly, the present invention is directed to a CMOS image sensor and fabricating method thereof that substantially obviate one or more problems due to limitations and disadvantages of the related art.

An object of the present invention is to provide a CMOS image sensor and fabricating method thereof, by which a planarization layer can be protected (e.g., prevented from being dissolved or weakened) by the penetration of chemicals via a silicon oxide microlens on the planarization layer.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, a method of fabricating a CMOS image sensor according to the present invention includes the steps of forming a plurality of photodiode regions on a semiconductor substrate, forming a plurality of color filters respectively corresponding to the photodiode regions, forming a planarization layer on the color filters, forming a planarization layer on the protective layer, and forming a plurality of microlenses corresponding to the photodiode regions by depositing a low-temperature oxide layer on the protective layer and then patterning the low-temperature oxide layer.

In another aspect of the present invention, a CMOS image sensor includes a plurality of photodiode regions on a semiconductor substrate, a plurality of color filters respectively corresponding to the photodiode regions (which may be uniformly spaced apart from each other), a planarization layer on the color filters, a protective layer on the planarization layer (e.g., configured to protect the planarization layer during processing of overlying materials), and a plurality of microlenses corresponding to respective photodiode regions comprising a patterned low-temperature oxide layer on the protective layer.

As mentioned in the foregoing description of a CMOS image sensor and fabricating method thereof according to the present invention, after a planarization layer has been formed on a color filter layer, a protective layer is formed on the planarization layer by plasma processing. Thus, damage to the planarization layer can be prevented that results from chemical penetration via pin holes in the low temperature silicon oxide microlens in the course of performing a wet process or the like. Therefore, the present invention prevents the microlens from exfoliating or peeling off from the planarization layer beneath the microlens.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
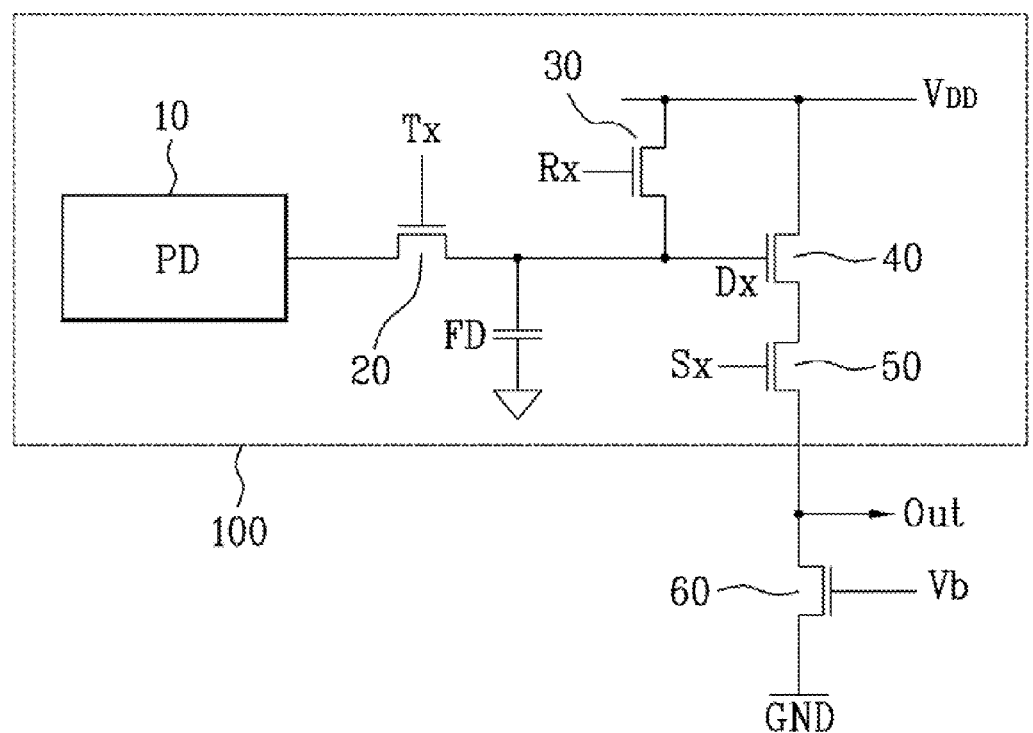
FIG. 1 is an exemplary circuit diagram of a 4T type CMOS image sensor.
Figure 2:
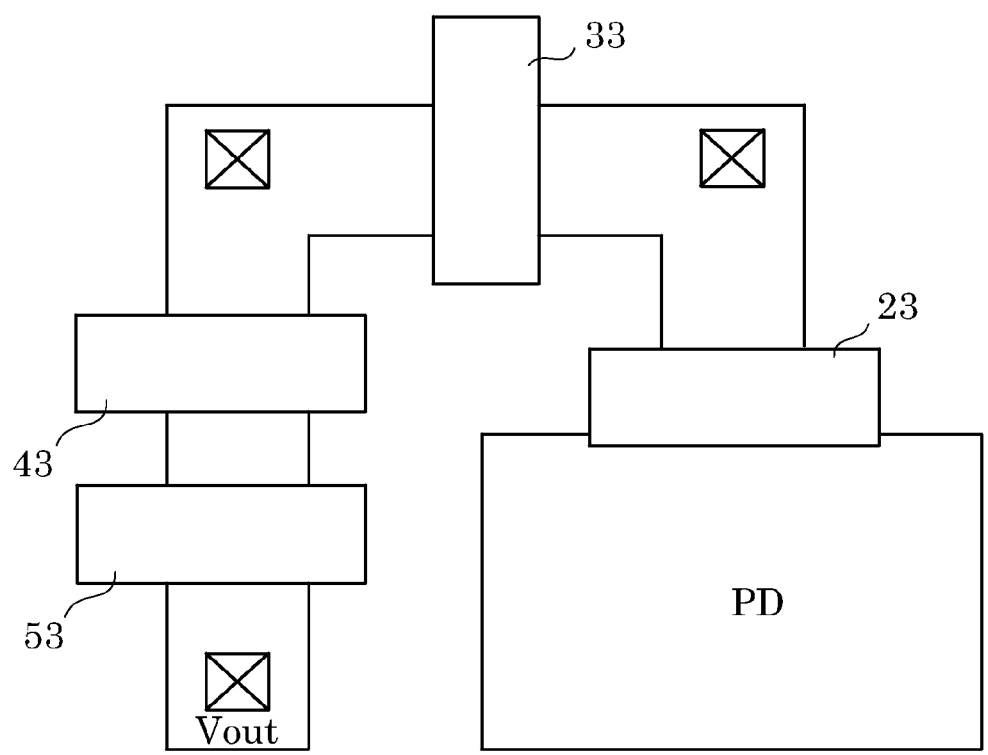
FIG. 2 is an exemplary layout of a unit pixel of a general 4T type CMOS image sensor.
Figure 3:
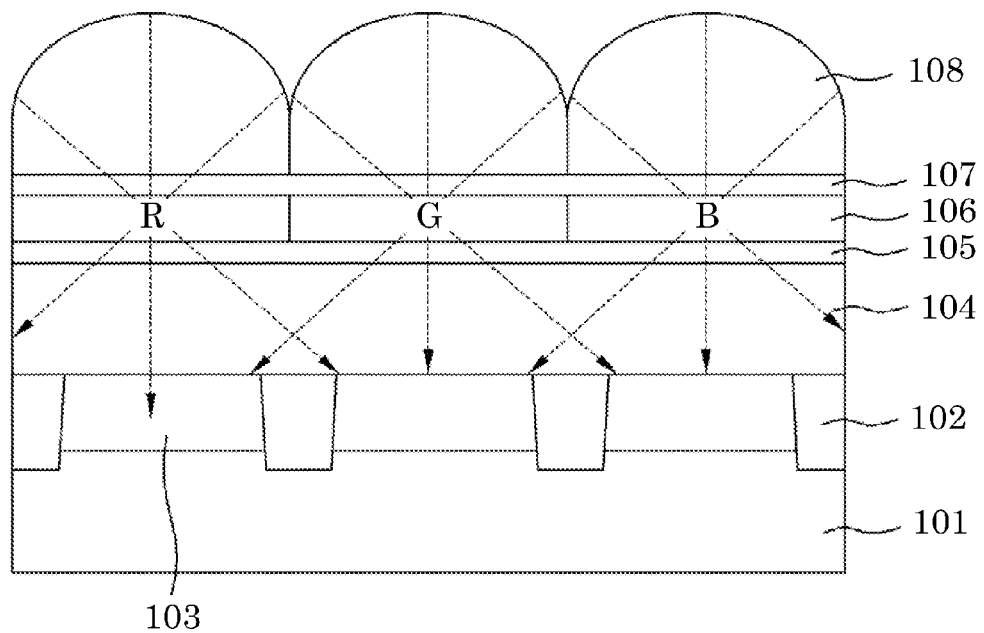
FIG. 3 is a cross-sectional diagram of a CMOS image sensor according to a related art approach.
Figure 4:
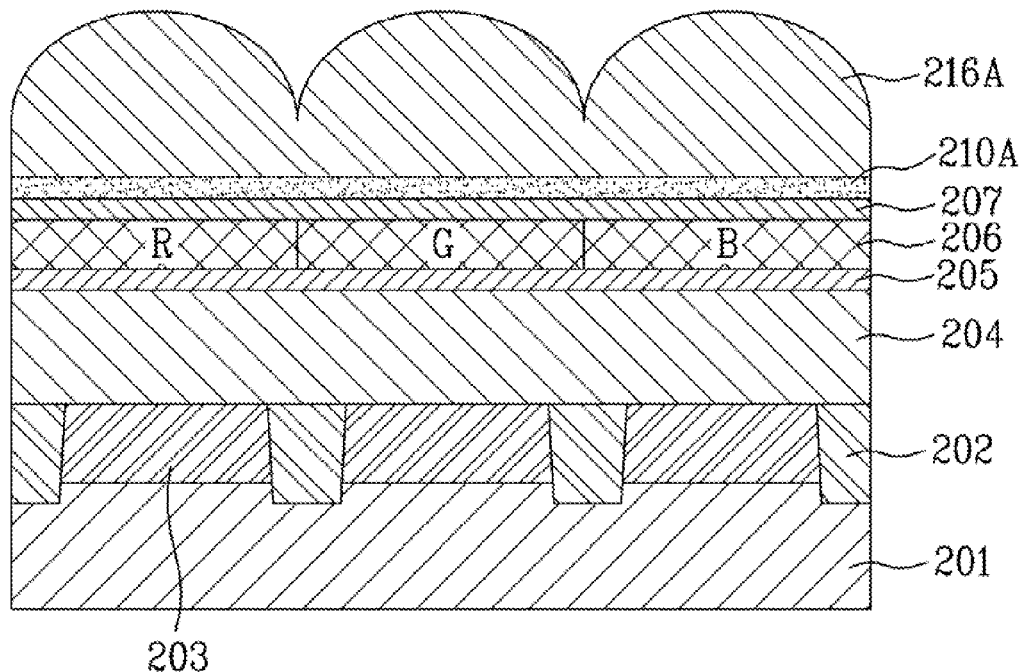
FIG. 4 is a cross-sectional diagram of an exemplary CMOS image sensor according to embodiments of the present invention.

FIG. 4 is a cross-sectional diagram of an exemplary CMOS image sensor according to embodiments of the present invention.

Referring to FIG. 4, a CMOS image sensor according to the present invention includes a device isolation layer 202 in a device isolation area of a semiconductor substrate 201, defined into the device isolation area and an active area, a photodiode region 203 in the active area of the semiconductor substrate 201, an insulating interlayer 204 over the semiconductor substrate 201 including the photodiode region 203 and the device isolation layer 202, a first planarization layer 205 on the insulating interlayer 204, a plurality of color filters 206 (e.g., red [R], green [G] and blue [B]) on the first planarization layer 105 corresponding to the photodiode regions 203, respectively, and a second planarization layer 207 over the semiconductor substrate 201, including the color filters 206. In one embodiment, the color filters 206 are uniformly spaced apart.

The CMOS image sensor according to the present invention further includes a protective layer 210A on the second planarization layer 207 to protect the second planarization layer 207 and microlenses 216A (respectively corresponding to the underlying photodiode regions) by depositing and patterning a low-temperature oxide layer on the protective layer 210A. In particular, the protective layer 210A plays a role in preventing the second planarization layer 207 from being damaged by the penetration of treatment chemicals via pin holes in the microlens 216A which comprises a low-temperature oxide layer. Namely, the protective layer 210A plays a role in protecting the second planarization layer 207 against chemicals.

In the CMOS image sensor according to the present invention, if the planarization layer 207 (which generally comprises an organic substance, such as a photoresist) exists on the color filter layer 206, if the protective layer 210A is formed on the planarization layer 207, and if a low-temperature oxide microlens 216A is provided, the structure under the color filter layer 206 is not limited to the structure shown in FIG. 4. Namely, the lower structure below the color filter layer 206 in the CMOS image sensor of the present invention can have any one of a number of diverse configurations. For instance, the first planarization layer 205 under the color filter layer 206 may not be provided. If the lower structure of the color filter layer 206 is implemented into a configuration different from that shown in FIG. 4 to improve performance of the image sensor, the present invention is applicable. Moreover, the CMOS image sensor according to the present invention is applicable to 3T, 4T and 5T types.

An exemplary method of fabricating a CMOS image sensor according to embodiments of the present invention is explained with reference to the accompanying drawings as follows.

FIGS. 5A to 5F are cross-sectional diagrams for explaining an exemplary method of fabricating a CMOS image sensor according to embodiments of the present invention.

Figure 5A:
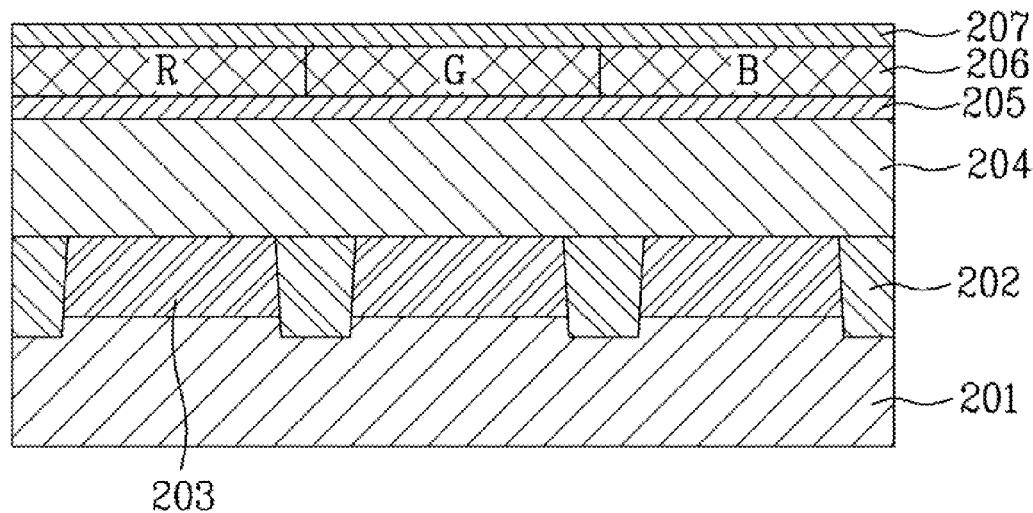
FIGS. 5A to 5F are cross-sectional diagrams of exemplary intermediate structures in an exemplary method of fabricating a CMOS image sensor according to embodiments of the present invention.

Referring to FIG. 5A, on a semiconductor substrate 201 defined into an active area and a device isolation area, a device isolation layer 202 is formed in the device isolation area to define the active area. In this case, the device isolation layer 202 may be formed by STI (shallow trench isolation), LOCOS (local oxidation of silicon), or the like (e.g., a combination of STI and LOCOS techniques).

A photodiode region 203 is formed in the active area isolated by the device isolation layer 202. For instance, an epitaxial process is performed (e.g., silicon, which may further include a p-type dopant such as phosphorous, may be epitaxially grown) on a p++ type semiconductor substrate 201 to form a p− type epitaxial layer (not shown in the drawing). A single-crystalline silicon substrate can be used as the semiconductor substrate 201. And, the photodiode region 203 can be formed in a surface of the semiconductor substrate 201 by lightly doping the active area of the semiconductor substrate 201 by ion implantation (e.g., first with a light concentration of n-type dopant, then with a medium concentration of p-type dopant at a shallower depth than the n-type dopant).

Subsequently, an insulating interlayer 204 is deposited over the semiconductor substrate 201 including the photodiode region 203 and the device isolation layer 202. In this case, the insulating layer 204 can comprise an oxide such as USG (undoped silicate glass).

Generally, the insulating layer 204 comprises a plurality of dielectric layers (not shown), each of which may independently comprise a lowermost etch stop layer (e.g., silicon nitride), one or more conformal and/or gap-fill dielectric layers (e.g., TEOS, plasma silane, or silicon-rich oxide), one or more bulk dielectric layers (e.g., silicon oxycarbide [SiOC], which may be hydrogenated [e.g., SiOCH]; undoped silicon dioxide [e.g., USG or a plasma silane]; or silicon dioxide doped with fluorine [e.g., FSG] or boron and/or phosphorous [e.g., BSG, PSG, or BPSG]), and/or one or more cap layers (e.g., TEOS, USG, plasma silane, etc.).

A metal interconnection (not shown) may be formed on or in each of the plurality of dielectric layers. Each metal interconnection may independently comprise one or more lowermost adhesive and/or diffusion barrier layers (e.g., titanium, titanium nitride, tantalum, tantalum nitride, etc., such as a titanium nitride-on-titanium bilayer), a bulk conductive layer (e.g., aluminum, an aluminum alloy [e.g., Al with from 0.5 to 4 wt. % Cu, up to 2 wt. % Ti, and/or up to 1 wt. % Si], or copper), and/or one or more uppermost adhesive, hillock prevention and/or antireflective coating layers (e.g., titanium, titanium nitride, titanium tungsten alloy, etc., such as a titanium nitride-on-titanium bilayer). The lowermost metal interconnection may be electrically connected to a source/drain terminal (e.g., of a transistor in the CMOS circuitry of the unit pixel) in the substrate 201 by a conventional tungsten plug or via, which may further include an adhesive and/or diffusion barrier layer (e.g., a titanium nitride-on-titanium bilayer) between it and the surrounding dielectric layer. An overlying metal interconnection 40 may be electrically connected to an underlying metal interconnection (e.g., the lowermost metal interconnection) by such a tungsten plug. Alternatively, a metal interconnection and the underlying plug or via may comprise a conventional dual damascene copper interconnection (which may further include an adhesive and/or diffusion barrier layer, such as a tantalum nitride-on-tantalum bilayer, and a seed layer such as sputtered copper, ruthenium or other metal, between it and the surrounding dielectric layer).

A first planarization layer 205 is formed on the insulating interlayer 204. The planarization layer 205 generally comprises a transparent resist material. A dyeable or dyed resist layer (e.g., comprising a red, green or blue dye) is coated on the first planarization layer 205. Exposure and development are performed on the dyed/dyeable resist layer to form a first color filter pattern. This process is repeated 2 times to form the second and third color filters. Therefore, a color filter layer 206 for filtering light in accordance with predetermined wavelength ranges is formed on the first planarization layer 205, optionally with a uniform interval (e.g., between individual filters of a particular color, such as between a green color filter and the nearest green color filter[s] thereto) to correspond to the photodiode regions 203, respectively.

A second planarization layer 207 is formed on the color filters using an organic substance (e.g., a transparent resist material). Generally, optical transmissivity is very important for an image sensor. In order to avoid interference between thin films due to a thickness of the second planarization layer 207, the thickness of the second planarization layer 207 may be 1,000~6,000 Å.

Figure 5B:
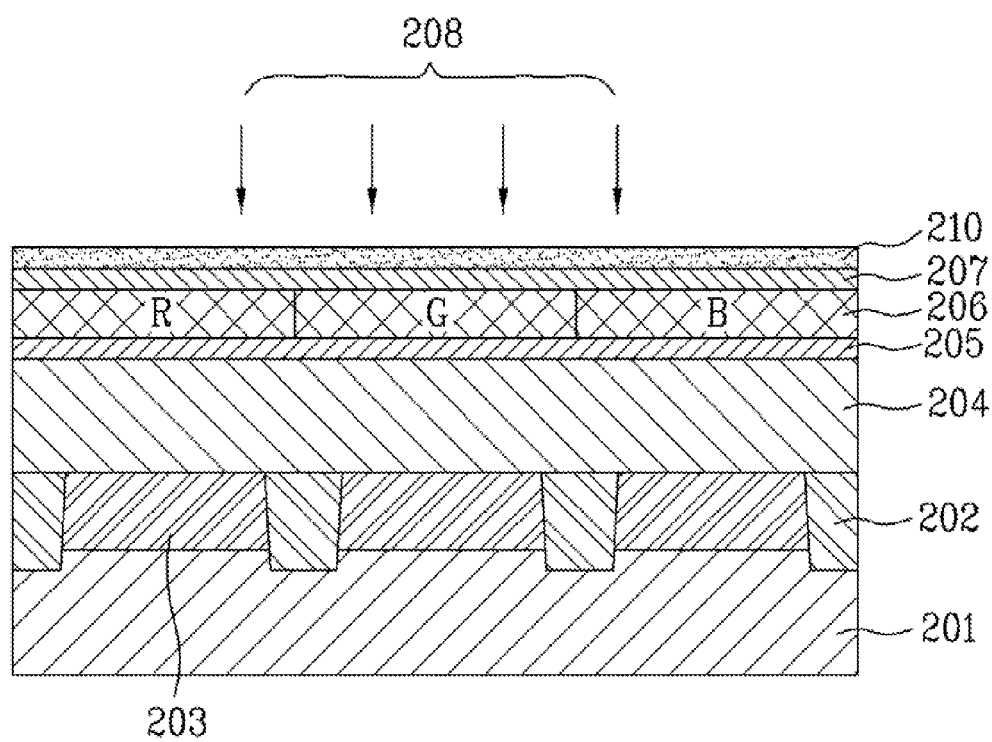
Figure 5C:
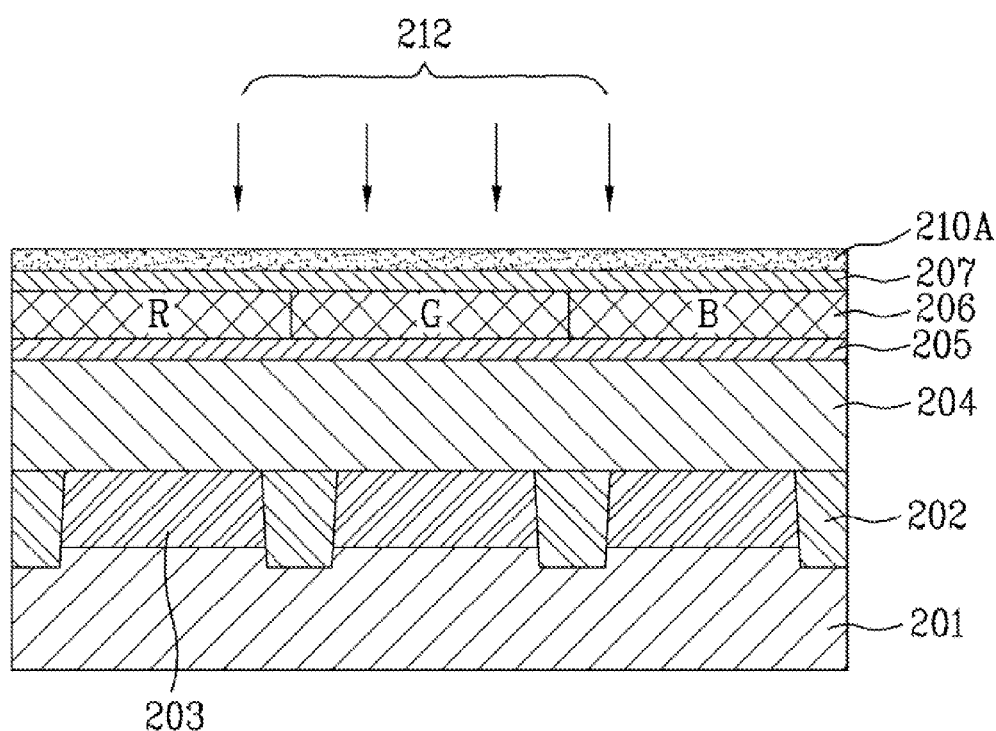

Referring to FIG. 5B and FIG. 5C, a protective layer 210 for protecting the second planarization layer 207 is formed on the second planarization layer 207. Preferably, the protective layer 210 has strong chemical resistance to the chemicals that may penetrate through the microlens 216A in the course of wet processing. According to an exemplary embodiment, the protective layer 210 can be formed in a following manner.

Referring to FIG. 5B, by performing inert gas plasma processing on the second planarization layer 207, the protective layer 210 can be formed. Thus, the protective layer may comprise a transparent photoresist material treated with a plasma comprising Ar, He, Ne and/or Kr, which may roughen the surface of the protective layer 210. For instance, the inert gas plasma processing can be performed under conditions comprising a bias power of 100~300 watts, a pressure of 2.5~3.5 torr, a process time of 15~30 seconds, and flow rates He of about 1,000 sccm and/or Ar of 500~1,500 sccm.

Referring to FIG. 5C, the method of forming the protective layer 210 may further comprise performing nitrogen gas plasma processing on the protective layer 210 shown in FIG. 5B, for example to harden its surface (e.g., by cross-linking the photoresist), whereby the protective layer 210A may be completed. The nitrogen gas plasma processing can be performed using a nitrogen source such as $N_2$, $NH_3$, $N_2H_4$, $HN_3$ or HCN, optionally with a hydrogen source such as $H_2$, $NH_3$, $N_2H_4$, $HN_3$, $SiH_4$, etc. In a preferred embodiment, nitrogen plasma processing comprises using a mixed gas containing $NH_3$ and $N_2$.

In particular, as mentioned in the above description, by the inert gas plasma processing 208, a top surface of the second planarization layer 207 is roughened to increase its specific surface area, for example by sputtering (or sputter etching) of He and Ar cations in the inert gas plasma. Subsequently, if the nitrogen gas plasma processing 212 is performed on the protective layer 210 having its specific surface area increased through the inert gas plasma processing 208, the protective layer 210A may have a hard property. Since the specific surface area is increased by the inert gas plasma processing 208, the top side of the protective layer 210 can be easily doped with nitrogen atoms in case of performing nitrogen plasma processing, and relatively easily reduced in case of hydrogen plasma processing.

The above-formed protective layer 210A can have a thickness of 100~300 Å. The nitrogen gas plasma processing can be performed under conditions comprising a bias power of 200~400 watts, a pressure of 2~4 torr, a process time of 10~30 seconds, and flow rates of $NH_3$ (or other hydrogen source gas) of 500~1,500 sccm and $N_2$ (or other nitrogen source gas) of 2,000~4,000 sccm.

Figure 5D:
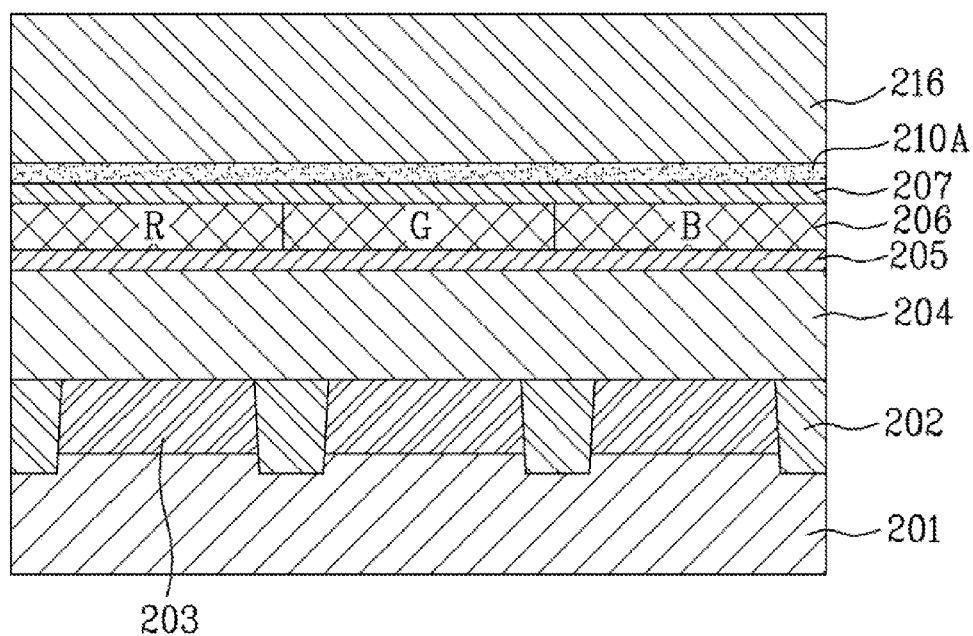

Referring to FIG. 5D, a low-temperature oxide (LTO) layer 216 is formed on the protective layer 210A. In this case, the oxide layer 216 may be formed at a temperature of 10~200° C. The LTO layer 216 may comprise silicon dioxide, and the LTO layer 216 may be formed by plasma enhanced chemical vapor deposition (PECVD) from silicon dioxide precursors (e.g., a silicon source such as silane gas or tetraethyl orthosilicate, and an oxygen source such as dioxygen and/or ozone) at a temperature of 250° C. or less. In various embodiments, the LTO layer 216 may be formed by PECVD at a temperature range of 150-200° C. with a thickness of 200-500 nm (e.g., about 370 nm).

Figure 5E:
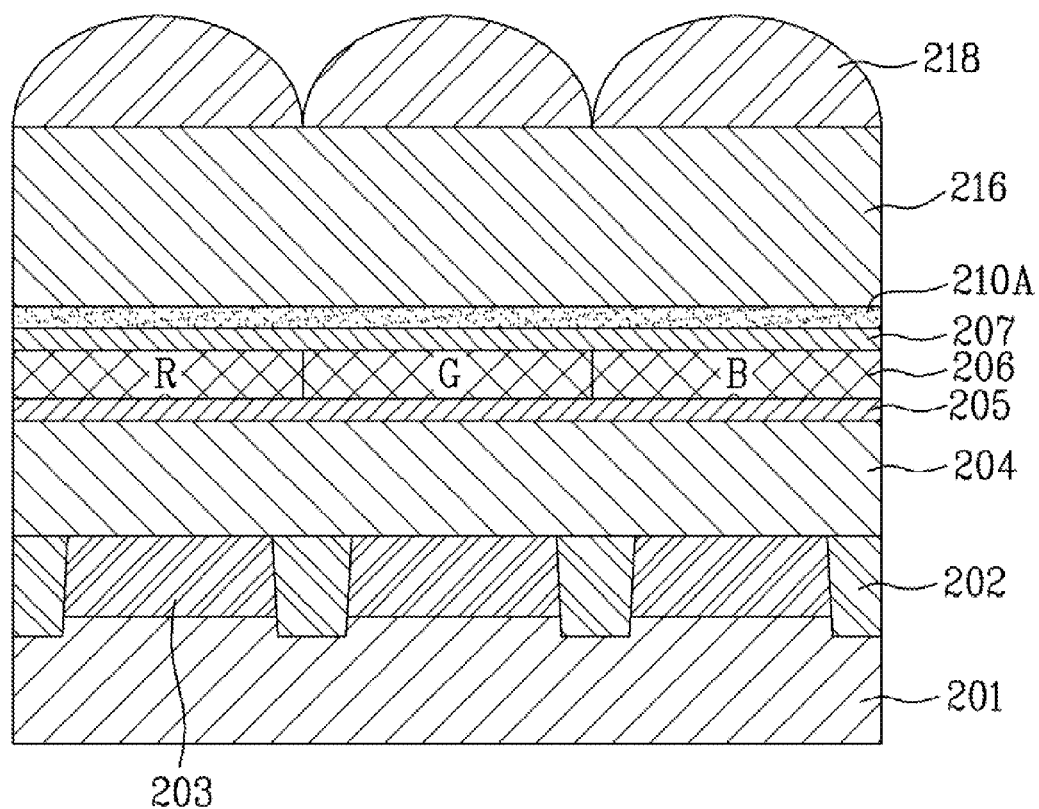

Referring to FIG. 5E, the deposited low-temperature oxide layer 216 is patterned. In particular, a resist layer (not shown in the drawing) is coated on the low-temperature oxide layer 216 shown in FIG. 5E and patterned, then the patterned resist layer is heated at a temperature of 200~700° C. to reflow the patterned resist and form a hemispherical or convex microlens pattern 218.

Figure 5F:
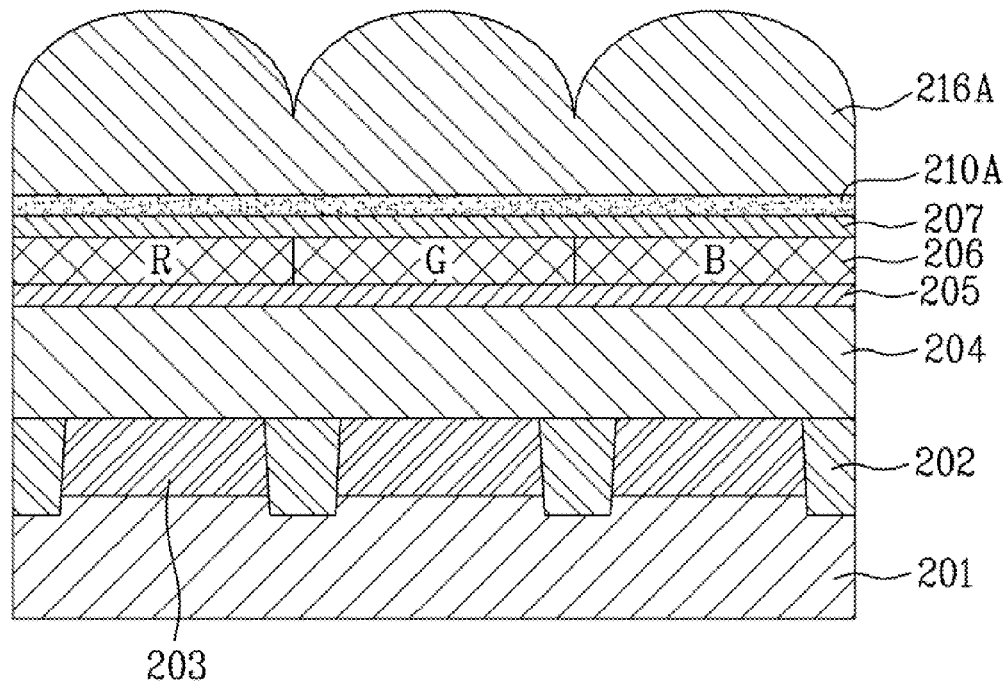

Referring to FIG. 5F, a blanket etch is performed on the curved microlens pattern 218 to form a curved microlens 216A on or in the protective layer 210A to correspond to each of the photodiode regions 203. Generally, to preserve the convex shape of the reflowed patterned resist 218, a relatively non-selective etch is performed. In other words, the etch selectivity for either the resist pattern 218 or the LTO layer 216 relative to the other may not exceed 2:1, 1.5:1 or 1.1:1. According to the present invention, and as described above, oxides such as TEOS (tetraethoxysilane) can be used as the substance for forming the microlens pattern 218 instead of resist.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a CMOS image sensor, comprising the steps of:
   forming a plurality of photodiode regions on a semiconductor substrate;
   forming a plurality of color filters respectively corresponding to the photodiode regions;
   forming a planarization layer on the color filters;
   forming a protective layer on the planarization layer, wherein forming the protective layer comprises processing the planarization layer with an inert gas plasma and thereafter performing nitrogen gas plasma processing on the planarization layer; and
   forming a plurality of microlenses corresponding to the photodiode regions by depositing a low-temperature oxide layer on the protective layer and then patterning the low-temperature oxide layer.

2. The method of claim 1, wherein the nitrogen gas plasma comprises a mixed gas containing $NH_3$ and $N_2$.

3. The method of claim 1, wherein the protective layer has a thickness of 100~300 Å.

4. The method of claim 1, wherein the inert gas plasma processing is performed under conditions comprising a bias power of 100~300 watts, a pressure of 2.5~3.5 torr, and flow rates of He of about 1,000 sccm and Ar of 500~1,500 sccm.

5. The method of claim 1, wherein the planarization layer has a thickness of 1,000~6,000 Å.

6. The method of claim 1, wherein the low-temperature oxide layer is deposited at 10~200° C.

7. The method of claim 1, wherein forming the microlenses comprises the steps of:
   depositing a photoresist on the low-temperature oxide layer;
   patterning the photoresist;
   forming a microlens pattern by reflowing the photoresist; and
   forming the microlens by etching the microlens pattern and the low-temperature oxide layer.

8. The method of claim 1, wherein the color filters are uniformly spaced apart from each other.

9. The method of claim 1, wherein the protective layer protects the planarization layer from damage by wet chemicals that may pass through the low-temperature oxide.

10. The method of claim 1, wherein the protective layer comprises a transparent photoresist material.

11. The method of claim 1, wherein a surface of the protective layer is roughened after processing with the inert gas plasma and hardened after processing with the nitrogen gas plasma.

12. The method of claim 1, wherein depositing the low-temperature oxide layer on the protective layer comprises plasma enhanced chemical vapor deposition (PECVD) of a silicon dioxide.

13. The method of claim 2, wherein the nitrogen gas plasma processing is performed under conditions comprising a bias power of 200~400 watts, a pressure of 2~4 torr, and flow rates of $NH_3$ of 500~1,500 sccm and $N_2$ of 2,000~4,000 sccm.

14. The method of claim 7, wherein reflowing comprises heating at a temperature of 200~700° C.

15. A method of fabricating a CMOS image sensor, comprising:
forming a plurality of photodiode regions on a semiconductor substrate;
forming a plurality of color filters respectively corresponding to the photodiode regions;
forming a planarization layer on the color filters;
forming a protective layer on the planarization layer, wherein forming the protective layer comprises processing the planarization layer with an inert gas plasma; and
forming a plurality of microlenses corresponding to the photodiode regions by depositing a low-temperature oxide layer on the protective layer and then patterning the low-temperature oxide layer.

16. The method of claim 15, wherein processing the planarization layer with the inert gas plasma comprises conditions including a bias power of 100~300 watts, a pressure of 2.5~3.5 torr, and flow rates of He of about 1,000 sccm and Ar of 500~1,500 sccm.

17. The method of claim 15, wherein forming the microlenses comprises:
depositing a photoresist on the low-temperature oxide layer;
patterning the photoresist;
forming a microlens pattern by reflowing the photoresist; and
forming the microlens by etching the microlens pattern and the low-temperature oxide layer.

18. A method of fabricating a CMOS image sensor, comprising:
forming a plurality of photodiode regions on a semiconductor substrate;
forming a plurality of color filters respectively corresponding to the photodiode regions;
forming a planarization layer on the color filters;
forming a protective layer on the planarization layer, wherein forming the protective layer comprises performing nitrogen gas plasma processing on the planarization layer, the nitrogen gas plasma comprises a mixed gas containing $NH_3$ and $N_2$, wherein the nitrogen gas plasma processing is performed under conditions comprising a bias power of 200~400 watts, a pressure of 2~4 torr, and flow rates of $NH_3$ of 500~1,500 sccm and $N_2$ of 2,000~4,000 sccm; and
forming a plurality of microlenses corresponding to the photodiode regions by depositing a low-temperature oxide layer on the protective layer and then patterning the low-temperature oxide layer.

19. The method of claim 18, wherein the planarization layer has a thickness of 1,000~6,000 Å and the protective layer has a thickness of 100~300 Å.

20. The method of claim 18, wherein forming the microlenses comprises the steps of:
depositing a photoresist on the low-temperature oxide layer;
patterning the photoresist;
forming a microlens pattern by reflowing the photoresist; and
forming the microlens by etching the microlens pattern and the low-temperature oxide layer.

* * * * *